(12) United States Patent
Shieh (10) Patent No.: US 6,240,109 B1
(45) Date of Patent: May 29, 2001

(54) WAVELENGTH STABILIZATION OF WAVELENGTH DIVISION MULTIPLEXED CHANNELS

(75) Inventor: William Shieh, Ocean Township, Monmouth County, NJ (US)

(73) Assignee: Lucent Technologies INC, Murray Hill, NJ (US)

( * ) Notice: Subject to any disclaimer, the term of this patent is extended or adjusted under 35 U.S.C. 154(b) by 0 days.

(21) Appl. No.: 09/257,708

(22) Filed: Feb. 25, 1999

(51) Int. Cl.[7] .................................................. H01S 3/10
(52) U.S. Cl. ................................................ 372/18; 372/32
(58) Field of Search ................................ 372/18, 29.01, 372/32

(56) References Cited

U.S. PATENT DOCUMENTS

| | | | |
|---|---|---|---|
| 4,835,782 | * | 5/1989 | Kaede et al. ............................ 372/32 |
| 5,631,758 | * | 5/1997 | Knox et al. ............................. 372/18 |
| 5,706,301 | | 1/1998 | Lagerström ............................ 372/32 |
| 6,111,681 | * | 8/2000 | Mizrahi et al. ........................ 372/32 |

* cited by examiner

Primary Examiner—James W. Davie
(74) Attorney, Agent, or Firm—John A. Caccuro (57) ABSTRACT

Laser wavelengths used in a WDM system are stabilized using a known accurate electrical frequency standard. The laser wavelengths are stabilized using a first frequency locking circuit which individually locks each laser wavelength to a different resonant frequency of an optical interferometer and a second frequency locking circuit which locks a different resonant frequency of the optical interferometer to an accurate electrical frequency standard signal. The known accurate electrical frequency standard prevents the resonator from drifting and the resonator prevents the WDM system lasers from drifting.

11 Claims, 8 Drawing Sheets

WAVELENGTH STABILIZATION OF WAVELENGTH DIVISION MULTIPLEXED CHANNELS

TECHNICAL FIELD OF THE INVENTION

This invention relates to Wavelength Division Multiplexed (WDM) systems and, more particularly, to a method of and apparatus for wavelength stabilization of WDM channels.

BACKGROUND OF THE INVENTION

Wavelength Division Multiplexing (WDM) is the prevalent solution for overcoming the bandwidth shortage problem in transmission facilities. With WDM, the capacity is increased by increasing the number of wavelength channels multiplexed over a single fiber. As the number of the wavelength channels grows, The channel spacing shrinks. This puts serious constraints on the absolute accuracy of the each individual wavelength channel. Ideally, the laser wavelength for each channel should be absolutely stabilized within a predetermined GHz range over its lifetime. However, the laser wavelength is prone to various instability, such as temperature sensitivity, acoustic motion sensitivity, bias current sensitivity and aging.

One prior art technique for stabilizing laser wavelength is to lock individual laser to a frequency discriminative device such as Fabry-Perot resonator or Bragg grating. Such a technique is described in the U.S. Pat. 5,706,301. A second approach is described in the article by T Mizuochi, et al., "622 Mbit/s-Sixteen-Channel FDM Coherent Optical Transmission System Using Two-Section MQW DFB-LDs", The transactions to the Institute of Electronics, Information and Communication Engineers of Jpa, B-I, Vol. J77-B-1. 5, pp.294–303, 1994. This approach uses a wide tuneable laser frequency which is swept, converting wavelength errors of each wavelength into time domain signal. Each individual pulse represents the difference of the laser wavelength and the center frequency of the Fabry-Perot resonator mode.

The first approach is undesirable because multiple resonators(filters) are needed which leads to a very expensive solution. In both of the prior approaches, the absolute accuracy of the laser wavelength is not guaranteed because the drift of the resonator (or filter) leads to the frequency drift of the laser. Although locking the resonator to an absolute optical frequency standard is suggested, an absolute frequency stabilized laser is still very expensive and not reliable.

What is needed is a cost effective and accurate technique for stabilizing the laser wavelengths used in a WDM system.

SUMMARY OF THE INVENTION

In accordance with the method and apparatus of my invention, laser wavelengths used in a WDM system are stabilized using a known accurate electrical frequency standard. The laser wavelengths are stabilized using a first frequency locking circuit which individually locks each laser wavelength to a different resonant frequency of an optical interferometer and a second frequency locking circuit which locks a different resonant frequency of the optical interferometer to an accurate electrical frequency standard signal. The known accurate electrical frequency standard prevents the resonator from drifting and the resonator prevents the WDM system lasers from drifting.

More particularly, apparatus is disclosed for stabilizing lasers used in a wavelength division multiplexed (WDM) system comprising (1) a first frequency locking circuit for locking each of the WDM laser frequencies to a different resonant frequency of an optical interferometer, the optical interferometer having a free spectral range (FSR) which is a fraction of the separation between the WDM laser frequencies; and (2) a second frequency locking circuit for locking a different resonant frequency of the optical interferometer to an accurate electrical frequency standard signal.

According to one aspect of my invention, the first frequency locking circuit includes (1) dither means for modulating each WDM laser frequency using a unique electrical dither signal; (2) an optical multiplexer for multiplexing together each of the dithered WDM laser frequencies into a multiplexed signal; (3) the optical resonator receiving the multiplexed signal and generating an optical frequency offset error signal for each WDM laser frequency; (4) an optical detector for detecting the optical error signals for each laser and for generating a multiplexed signal including an electrical error signal for each laser frequency; and (5) a wavelength control circuit for comparing each electrical error signal with the electrical dither signal and in response thereto generating a separate feedback control signal for adjusting the frequency of each of the WDM lasers.

According to another aspect of my invention, the second frequency locking circuit includes (1) a first and second auxiliary laser frequencies signals; (2) a coupler for combining the first and the second auxiliary laser frequency signals; (3) an optical detector for detecting the first and the second auxiliary laser frequency signals and generating therefrom an electrical difference frequency signal; (4) a comparator circuit for comparing the accurate electrical frequency standard signal with the electrical difference frequency signal and for generating therefrom an error control signal for controlling the resonance frequencies of the optical resonator so as to minimize the error signal.

According to a feature of my invention, the optical interferometer may be selected from a group including a Fabry-Perot resonator and a Mach-Zehender interferometer. According to another feature, the electrical accurate clock standard signal is selected from a group including a stratum clock signal, a national frequency standard, and a global positioning system (GPS) distributed frequency standard.

BRIEF DESCRIPTION OF THE DRAWING

In the following description, identical element designations in different figures represent identical elements. Additionally in the element designations, the first digit refers to the figure in which that element is first located (e.g., 109 is located in FIG. 1).

DETAILED DESCRIPTION

Figure 1:
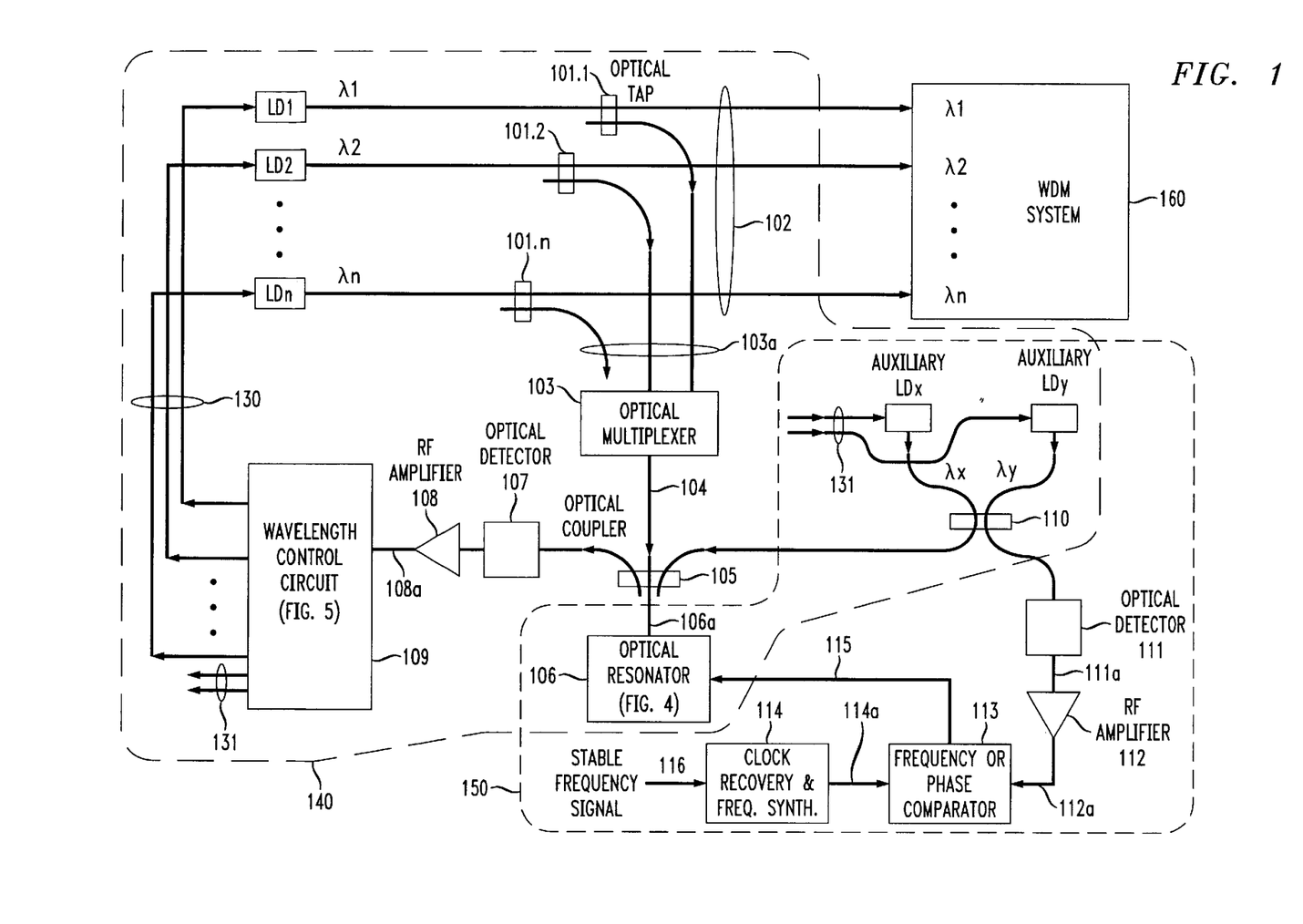
FIG. 1 shows an illustrative block diagram of my apparatus for maintaining wavelength stabilization of WDM channels.

Shown in FIG. 1 is an illustrative block diagram of my apparatus for maintaining wavelength stabilization of WDM channels. In accordance with my invention, a first frequency locking circuit 140 individually locks each WDM channel laser signal $\lambda 1$–$\lambda n$ (102) used by a WDM system 160 and locks each of the auxiliary laser signals $\lambda x$ and $\lambda y$ to a different resonant frequency of an optical interferometer (e.g., resonator 106). A second frequency locking circuit 150 stabilizes the resonator 106 by locking the difference in frequencies of auxiliary laser signals $\lambda x$ and $\lambda y$ (located at two other resonant frequencies of the optical resonator 106) to an accurate electrical frequency (e.g., clock) standard signal 114. The known accurate electrical frequency standard 114 prevents the resonator 106 from drifting and the resulting stabilized resonator prevents the WDM system lasers signals $\lambda 1$–$\lambda n$ from drifting.

The apparatus of the first frequency locking circuit 140 includes the laser sources LD1–LDn, couplers 101.1–101.n, optical multiplexer 103, coupler 105, optical resonator 106, optical detector 107, RF amplifier 108 and wavelength control circuit 109. The apparatus of the second frequency locking circuit 150 includes auxiliary laser sources LDx and LDy, optical coupler 110, optical detector 111, RF amplifier 112, frequency/phase comparator 113, optical resonator 106, coupler 105, and accurate frequency standard circuit 114.

Figure 6:
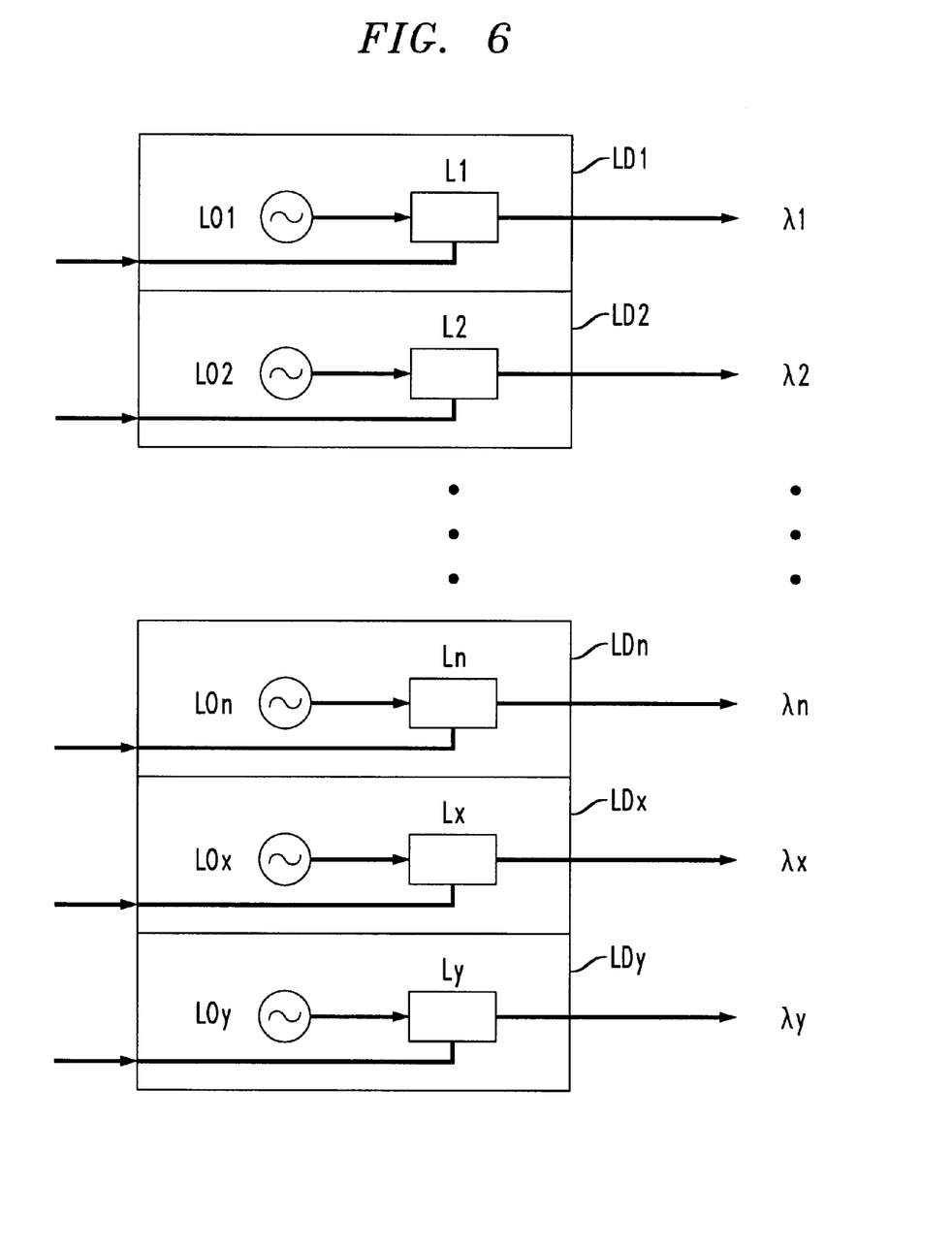
FIG. 6 shows an illustrative laser frequency/phase dithering circuit for use in the apparatus of FIG. 1.
Figure 7:
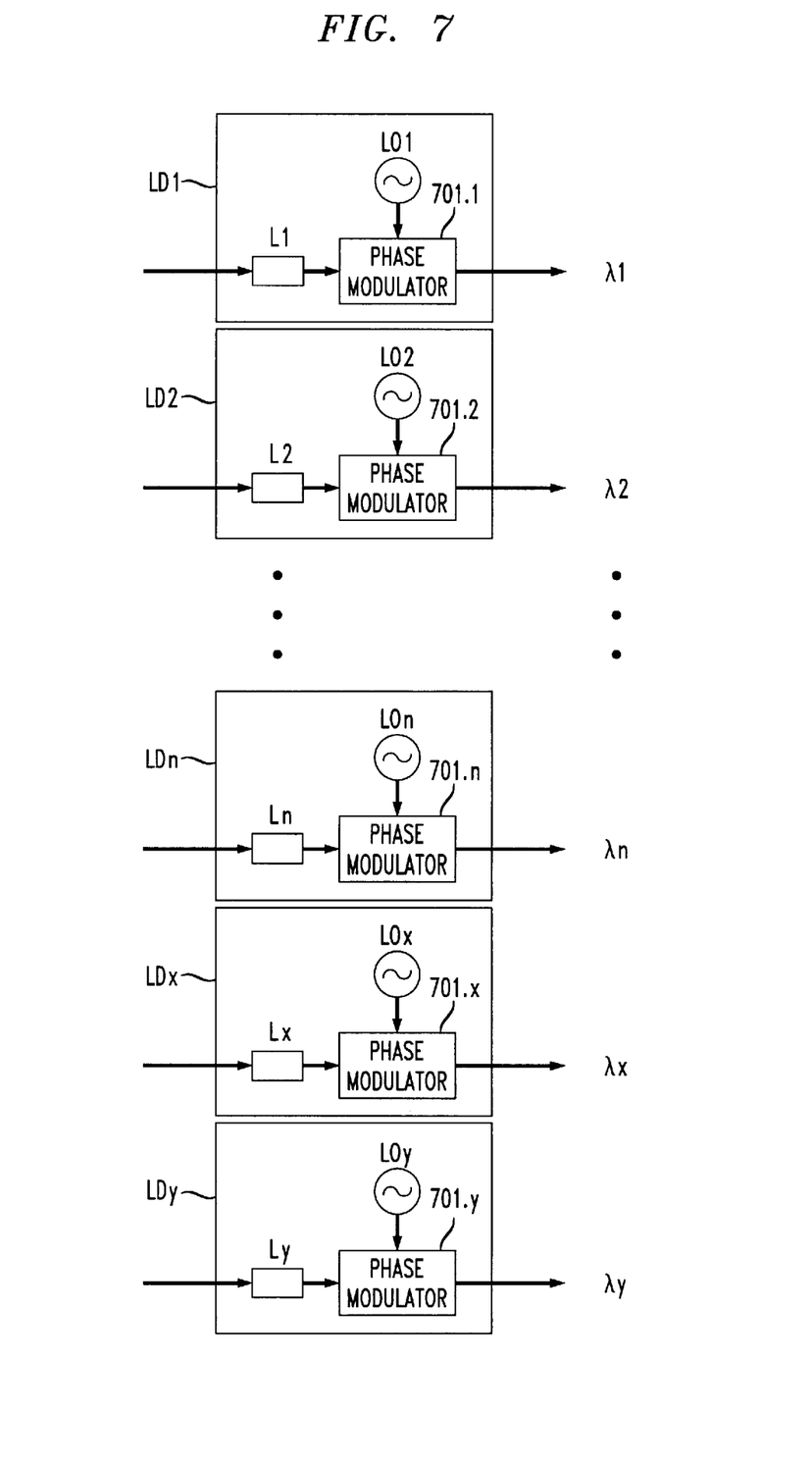
FIG. 7 shows another illustrative laser frequency/phase dithering circuit.

In the first frequency locking circuit 140, each of the laser sources LD1–LDn, LDx and LDy are frequency/phase dithered using an associated different dither signal, LO1–LOn, LOx and LOy (see FIG. 6), respectively. These dither laser sources LD1–LDn, LDx and LDy may be implemented as shown in FIG. 6 or 7. In FIG. 6, there is shown a first illustrative laser frequency/phase dithering circuit which can be used as dithered laser sources LD1–LDn, LDx and LDy. As shown, each of the dither signals LO1–LOn, LOx and LOy are used to directly frequency/phase modulate a respective one of the laser sources L1–Ln, Lx and Ly to produce the dithered WDM wavelength signals $\lambda 1$–$\lambda n$, $\lambda x$ and $\lambda y$. Each of the dither signals LO1–LOn, LOx and LOy use a different frequency so that they can each be easily separated into separate error control signals 130 by wavelength control circuit 109. These separate error control signals 130 are feedback control signals used to control a phase or frequency control parameter of each of the laser L1–Ln, Lx and Ly. Depending on the type of laser L1–Ln, Lx and Ly utilized, the phase/frequency control parameter can be laser current, temperature etc.

Shown in FIG. 7 is a second illustrative laser frequency/phase dithering circuit which can be used as dithered laser sources LD1, LD2 through LDy. As shown, each of the dither signals LO1, LO2 through LOy are used to drive a different phase modulator 701.1, 701.2 through 701.y directly to phase modulate a respective one of the lasers L1, L2 through Ly. Again each of the dither signals LO1, LO2 through LOy use a different frequency so that they can each be easily separated into separate error control signals 130 by wavelength control circuit 109. These separate error control signals 130 are feedback control signals used to control a phase control parameter of each of the modulators 701.1–701.y. Depending on the type of modulator utilized, the phase control parameter can be current, voltage, temperature etc.

Returning to FIG. 1, the dithered wavelength signals $\lambda 1$–$\lambda n$ are outputted 102 to the WDM system 160 and a portion 103a is coupled via couplers 101.1–101.n to optical multiplexer 103. The dithering only causes a small intensity modulation of the optical signal, therefore it does not affect the use of the wavelength signals $\lambda 1$–$\lambda n$ by the WDM system 160. The resulting combined dithered WDM signal 104 from optical multiplexer 103 is coupled, via coupler 105, to an optical resonator 106. Additionally, the dithered wavelength signals $\lambda x$–$\lambda y$ from LDx and LDy are coupled, via coupler 110, to optical resonator 106. The optical resonator 106 utilized can be any of a variety of resonators (e.g., a Fabry-Perot resonator) or interferometer (e.g., a Mach-Zehnder interferometer) that possess the desired frequency discriminating characteristics. In the following description it is assumed that a Fabry-Perot resonator is used as resonator 106.

Figure 2:
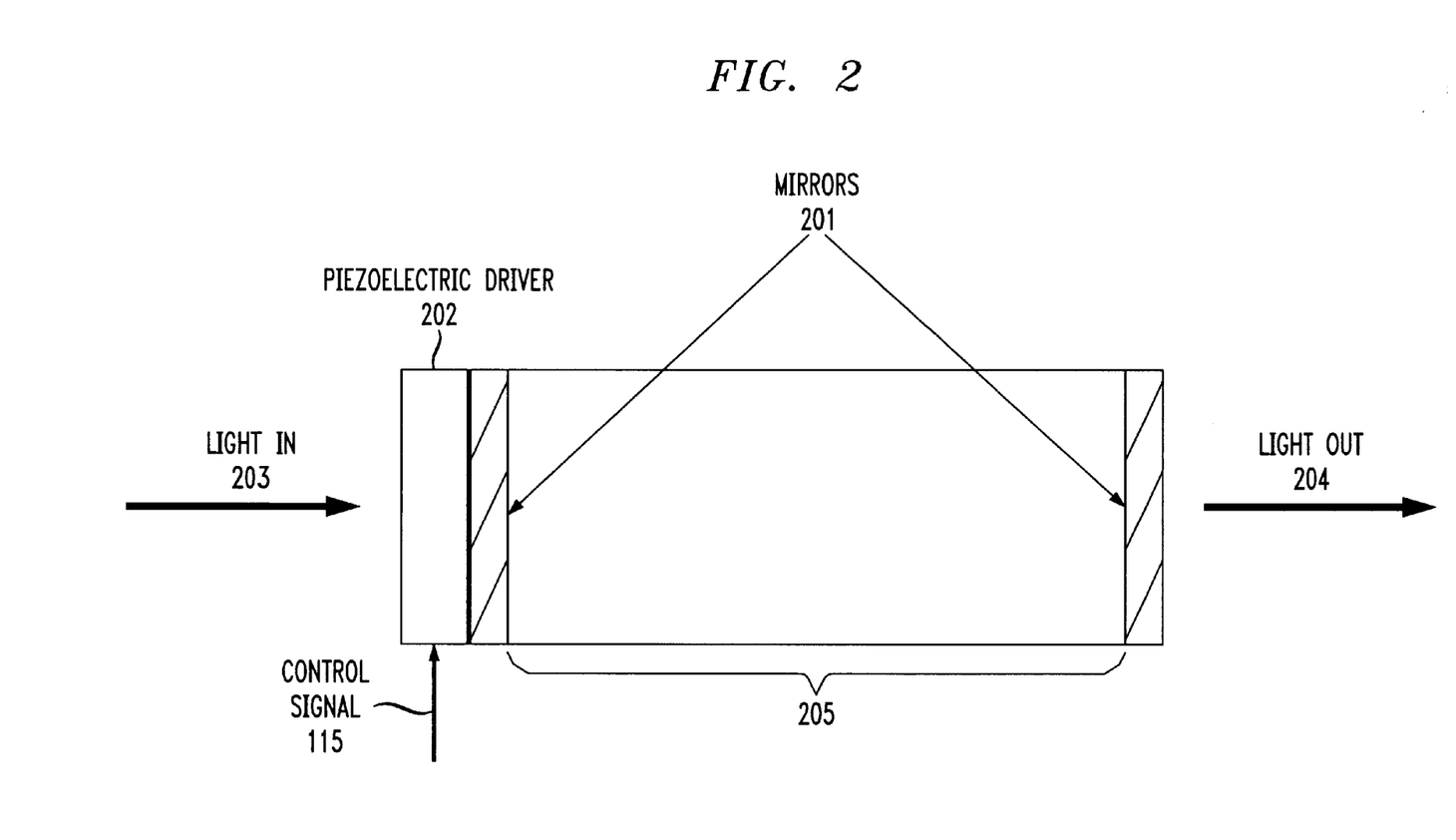
FIG. 2 shows an illustrative resonator for use in the apparatus of FIG. 1.

Shown in FIG. 2 is an illustrative example of a well known Fabry-Perot resonator for use as resonator 106 in the apparatus of FIG. 1. As shown, the resonator 106 is a resonator including two-mirrors 201 and a piezoelectric driver 202. Light input signals 203 from coupler 105 enters from the left side perpendicular to the mirrors and is reflected back and forth between mirrors 201. The Fabry-Perot resonator 106 operates so that only wavelengths of the resonance frequencies of the free spectral range (FSR) exit as light output signals 204 from the right side mirror. Note that the Fabry-Perot resonator 106 used in FIG. 1 is operated in a reflective mode where the light input signal 203 and the light output signal 204 enter and exit the same side of the resonator 106. Thus, if the light input signal 203 from coupler 105 is at a FSR frequency it can exits as a light output signal 204. The piezoelectric driver 202 operates under control of a control signal 115 from the frequency/phase comparator circuit 113. The control signal 115 controls the displacement of the piezoelectric driver changing the gap 205 resulting in a shift of all of the FSR frequencies. Since the FSR frequencies can drift due to temperature or other conditions, with a suitable control signal 115 to the piezelectric driver 202, the FSR frequencies can be maintained constant. In accordance with my invention, this technique is used by the second frequency locking circuit 150 of FIG. 1 to lock the FSR frequencies to an accurate frequency standard signal.

Figure 3:
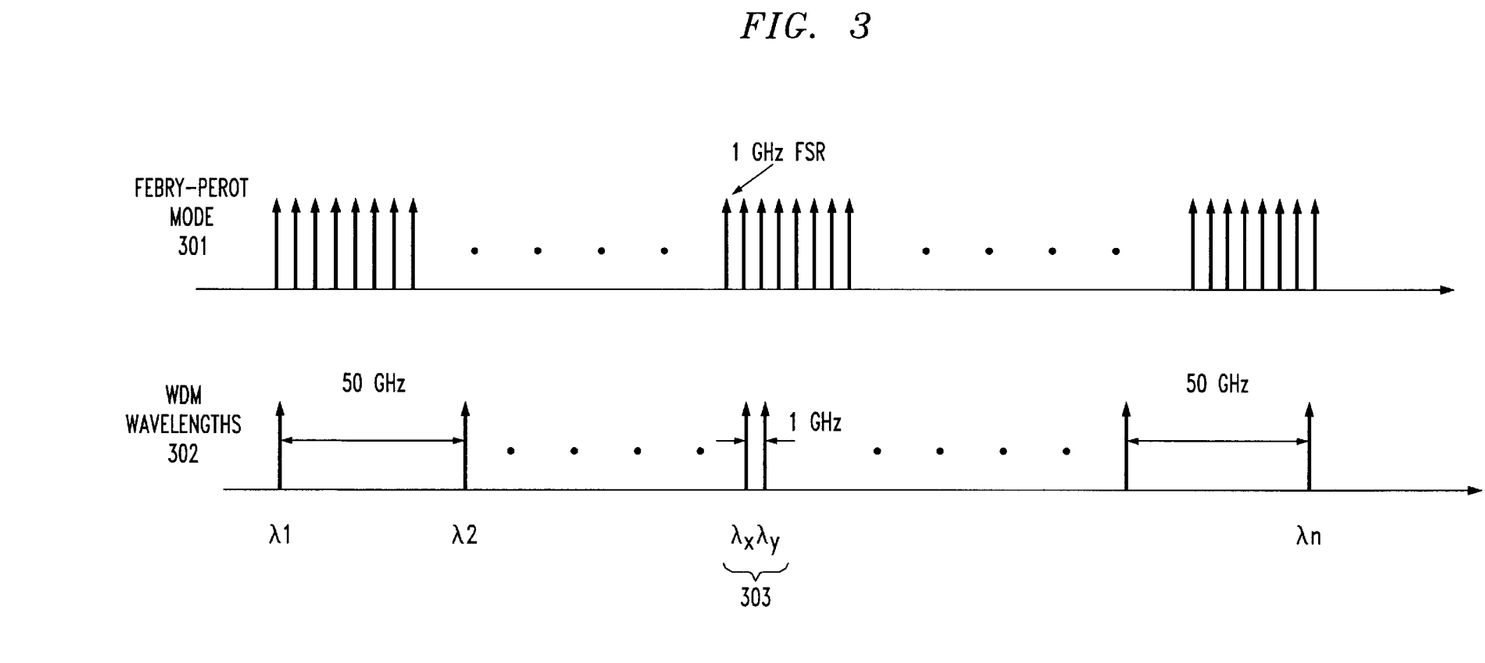
FIG. 3 shows an illustrative spectral frequency diagram of the WDM wavelengths and the resonance FSR frequencies of a Fabry-Perot resonator.

With reference to FIG. 3, there is shown an illustrative spectral frequency diagram of the resonance FSR frequencies 301 of the Fabry-Perot resonator 106 and the dithered WDM wavelengths 302 and auxiliary wavelengths $\lambda x$ and $\lambda y$ (303) received by the Fabry-Perot resonator 106. As shown, the resonance FSR frequencies 301 have an illustrative spacing of 1 GHz and the WDM wavelengths $\lambda 1$–$\lambda n$ have an illustrative spacing of 50 GHz. The auxiliary wavelengths $\lambda x$ and $\lambda y$ are also shown to have an illustrative spacing of 1 GHz and are selected to be at two adjacent FSR resonance frequency modes within the central region of the WDM wavelength band $\lambda 1$–$\lambda n$. In accordance with my invention, each of the wavelengths $\lambda 1$–$\lambda n$ and auxiliary wavelengths $\lambda x$ and $\lambda y$ is locked to a different FSR frequency modes 301 of Fabry-Perot resonator 106. The free spectrum range (FSR) of the resonator 106 is selected so that the WDM wavelength channel spacing is a multiple of the FSR resonance frequency mode spacing. For example, for our illustrative WDM channel spacing of 50 GHz, the FSR range may be chosen to be 0.01 GHz to 50 GHz. The FSR range selection is made to limit the cost of the optical detector and RF components used in FIG. 1. The greater the ratio of the WDM channel spacing to the FSR spacing the more accurate each of the WDM channels and the spacing between WDM channels can be controlled.

Figure 4:
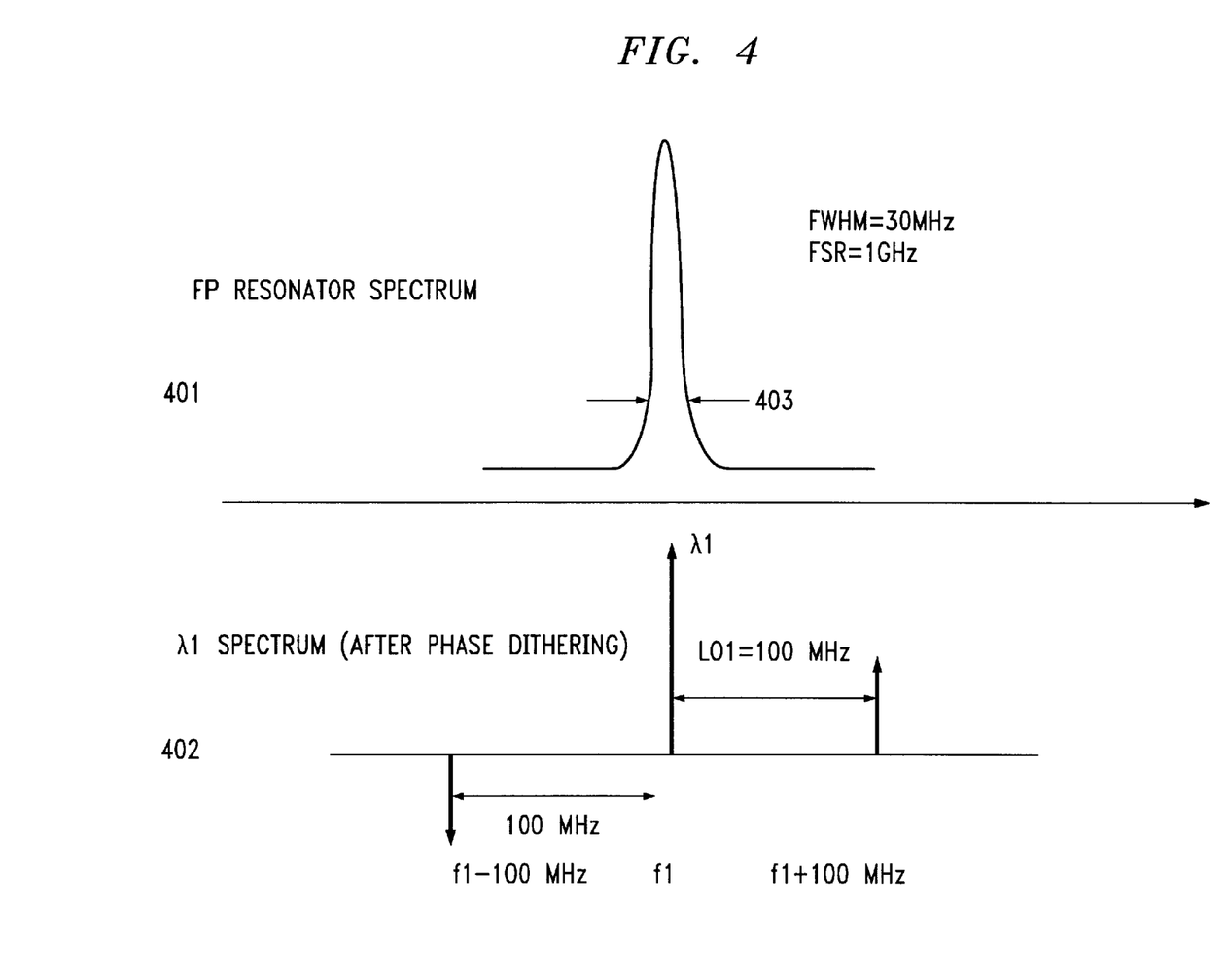
FIG. 4 shows an illustrative close-up of the technique used for frequency locking of a dithered WDM wavelength to a resonance frequency of the resonator.

Shown in FIG. 4 is an illustrative close-up of a diagram useful in understanding the frequency locking of a phase dithered WDM wavelength 402 to a FSR resonance mode frequency 401 of the Fabry-Perot resonator 106. The illustrative frequency bandwidth (FWHM) 403 of the resonance frequency 401 is shown to be 30 MHz and the illustrative spectrum of the phase dithering of frequency f1 (i.e., for wavelength $\lambda 1$) is shown to be f1−100 MHz to f1+100 Mhz. That is, the phase dithering signal LO1 cause the wavelength $\lambda 1$ frequency (i.e., f1) to vary over the range f1−100 MHz to f1+100 Mhz. With reference to FIG. 1, the output 106a from resonator 106 is a frequency error signal which is proportional to the difference between the center frequency of the FSR resonance frequency 401 and the wavelength $\lambda 1$ frequency (i.e., f1). It should be noted that the frequency error signal occurs at the dither frequency LO1 which modulates the wavelength $\lambda 1$ frequency. Additionally, the output 106a from resonator 106 includes the frequency error signals from each of the other dithered WDM wavelength signals LO2–LOn as well as the dithered auxiliary wavelengths LOx and LOy. As previously noted, since each of the dithered WDM wavelength signals use a different dither frequency each frequency error signal can be readily distinguished after detection by optical detector 107. The output from optical detector 107 is amplified by RF amplifier 108 and the combined frequency error signal outputted 108a to the wavelength control circuit 109.

Figure 5:
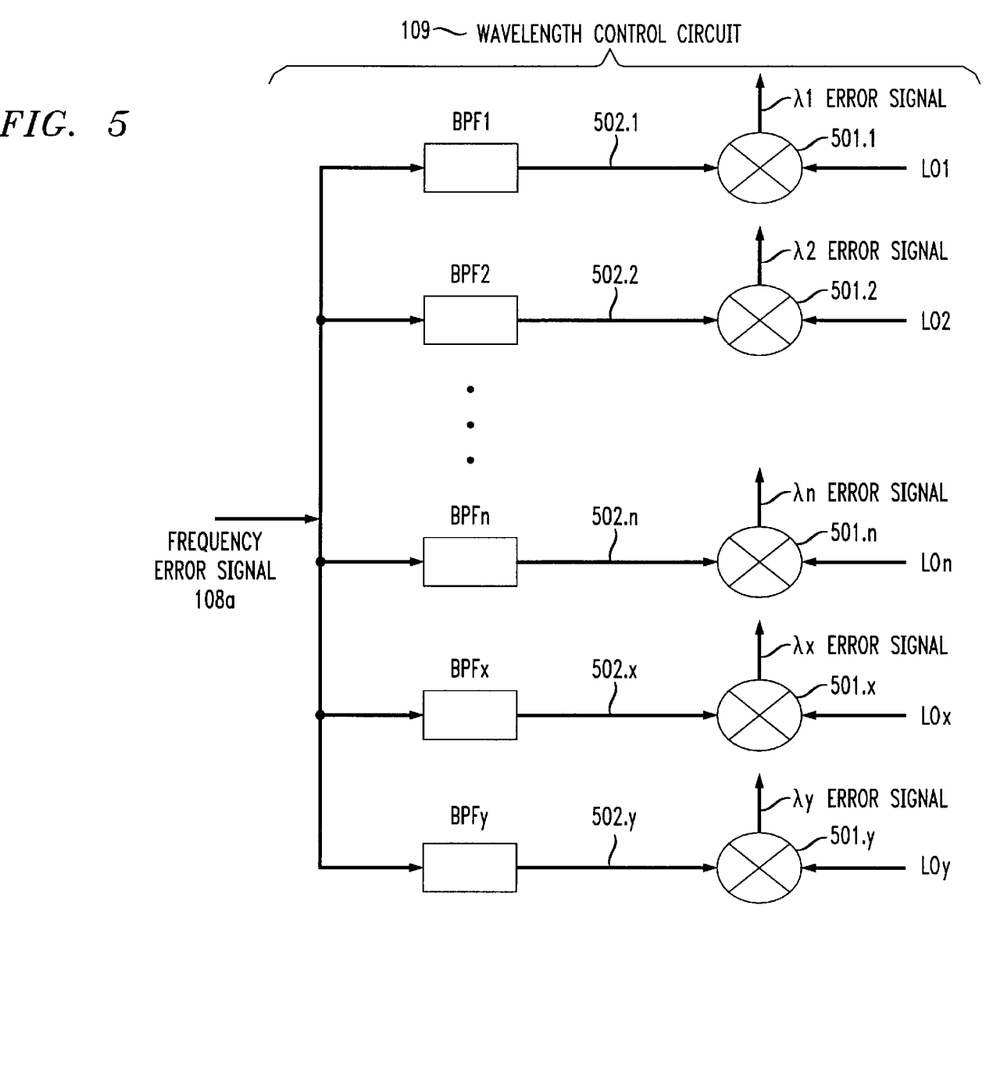
FIG. 5 shows the operation of the wavelength control circuit 109.

With reference to FIG. 5, the operation of the wavelength control circuit 109 is described. The combined frequency error signal 108a from RF amplifier 108 is received by the bandpass filters BPF1–BPFn, BPFx and BPFy where each filter separates only the frequency error signal associated with its wavelength. Thus, for example, filter BPF1 selects only the frequency error signal at the dither frequency LO1, filter BPF2 selects the dither frequency LO2 frequency error signal and so on. The mixers 501.1–501.n, 501.x and 501.y each multiply the respective inputs of dither signals LO1–LOn, LOx and LOy with the respective frequency error signals 502.1–502.n, 502.x and 502.y. The outputs 503.1–503.n, 503.x and 503.y from multipliers 501.1–501.n, 501.x and 501.y are the frequency (or wavelength) error signals for each of the WDM wavelength signals $\lambda 1$–$\lambda n$, $\lambda x$ and $\lambda y$ respectively. With reference to FIG. 1, these frequency error signals or feedback control signals 130 are used to adjust the frequency of the laser sources LD1–LDn. The feedback control signals 131 are used to adjust the frequency of the laser sources LDx–LDy. In this manner, the frequency of each of the WDM wavelength signal $\lambda 1$–$\lambda n$, $\lambda x$ and $\lambda y$ is locked to its associated FSR frequency mode of resonator 108. As previously noted, the second frequency locking circuit 150 of FIG. 1 is used to stabilize the FSR mode frequencies which would otherwise vary due to aging and environmental conditions of resonator 108.

With continued reference to FIG. 1, the operation of the second frequency locking circuit 150 is described. As previously noted, auxiliary laser sources LDx and LDy are also dithered laser signals that output their dithered wavelength signals $\lambda x$ and $-\lambda y$, respectively, to coupler 105. As noted before, coupler 105 couples the combined dithered wavelength signals $\lambda x$ and $-\lambda y$ signal to optical resonator 106. The coupler 105 also couples the combined dithered wavelength signals $\lambda x$ and $-\lambda y$ signal to optical detector 111 which performs optical heterodyning or beating (due to square law detection) which generates a RF signal 111a. The frequency of RF signal 111a is equal to the frequency difference of the two auxiliary lasers, which, as I have noted, is the FSR mode frequency spacing of the resonator 106. The RF signal 111a is amplified in RF amplifier 112. According to my invention the amplified RF signal 112a (or beating signal) carries the frequency stability information of the resonator 106. If the resonator 106 is perturbed due to any noise source (or environmental or aging conditions), the FSR spacing of the resonator 106 will change and as a result the RF or beating frequency signal 112a will change accordingly. This RF frequency signal 112a is compared in comparator 113 (e.g., a RF mixer or frequency counter) to an RF frequency standard 114a. The resulting error signal 115 generated is used to control the FSR spacing of the resonator 106. This could be done, for example, by applying the proper voltage to the piezoelectric driver (202 of FIG. 2) on the resonator 106 or by changing the temperature of the substrate of the resonator 106, which essentially changes the spacing of the mirror to compensate for any disturbance. In this manner, the error control signal 115 readjusts the FSR spacing of resonator 106 to compensate for any noise source perturbations (or environmental or aging conditions).

Figure 8:
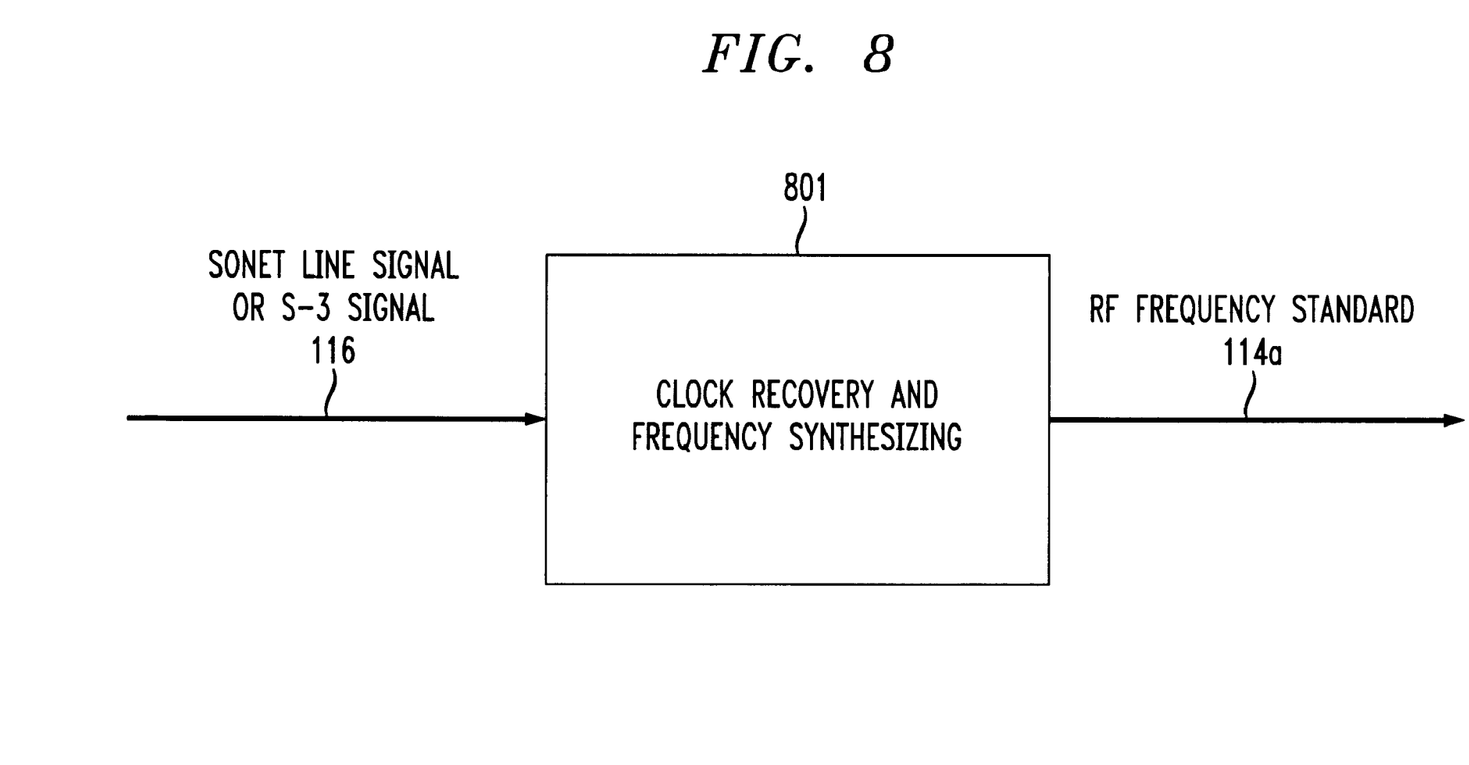
FIG. 8 shows an illustrative clock acquisition circuit for use in the apparatus of FIG. 1.

With reference to FIG. 8, there is shown an illustrative frequency or clock acquisition circuit for use in the apparatus of FIG. 1. As shown the RF frequency standard 114a may be generated in a clock recovery and frequency synthesizing circuit 801 which uses a stable frequency input signal 116, such as a Sonet line signal or a S-3 clock signal (stratum signal—level 3) which is distributed through the communication networks, which is universally available and reliable because certain accuracy is guaranteed to achieve network synchronization e.g., see the article "AT&T New Approach to the Synchronization of Telecommunication Networks", IEEE Communications Magazine, pp.35–45, April, 1989). Initially, an absolute optical frequency standard is used for the initial setup, this wavelength stabilization scheme does not need an absolute optical frequency standard after the initial setup. In fact, the accuracy of required clock at most is only 5 ppm which is equivalent to that of the timing stratum S-3. This frequency standard can also be derived from any national frequency standard or any global positioning system (GPS) distributed frequency standard. Thus, the novelty of my invention is that I tie the stability of the optical wavelengths to any of the well known frequency standards.

What has been described is merely illustrative of the application of the principles of the present invention. Thus, for example, other types of resonators can be used, other FSR values may be used with the Fabry-Perot resonator, and other types of frequency error detection schemes can be used. Other methods and arrangements can be implemented by those skilled in the art without departing from the spirit and scope of the present invention.

What is claimed is:

1. Apparatus for stabilizing laser frequencies used in a wavelength division multiplexed (WDM) system comprising:

first frequency locking circuit for locking each of the WDM laser frequencies to a different resonant frequency of an optical interferometer, the optical interferometer having a free spectral range (FSR) which is a fraction of the separation between the WDM laser frequencies; and second frequency locking circuit for locking a different resonant frequency of the optical interferometer to an accurate electrical frequency standard signal.

2. The Apparatus of claim 1 wherein the optical interferometer is selected from a group including a Fabry-Perot resonator and a Mach-Zehender interferometer.

3. The Apparatus of claim 1 wherein the optical interferometer is a Fabry-Perot resonator which has a FSR in the range of 0.01 to 50 GHz.

4. The Apparatus of claim 1 wherein the first frequency locking circuit includes dither means for modulating each WDM laser frequency using a unique electrical dither signal;

an optical multiplexer for multiplexing together each of the dithered WDM laser frequencies into a multiplexed signal;

the optical resonator receiving the multiplexed signal and generating an optical frequency offset error signal for each WDM laser frequency;

an optical detector for detecting the optical error signals for each laser and for generating an electrical error signal for each WDM laser frequency; and a wavelength control circuit for comparing each electrical error signal with the electrical dither signal and in response thereto generating a separate feedback control signal for adjusting the frequency of each of the WDM lasers.

5. The Apparatus of claim 1 wherein the second frequency locking circuit includes a first and second auxiliary laser frequencies signals;

a coupler for combining the first and the second auxiliary laser frequency signals;

an optical detector for detecting the first and the second auxiliary laser frequency signals and generating therefrom an electrical difference frequency signal;

a comparator circuit for comparing the accurate electrical frequency standard signal with the electrical difference frequency signal and for generating therefrom an error control signal for controlling the resonance frequencies of the optical resonator so as to minimize the error control signal.

6. The Apparatus of claim 5 wherein the first and second auxiliary laser frequencies signals are each dithered using a unique electrical signal and wherein the dithered first and second auxiliary laser frequencies signals are processed and adjusted in the same manner as the WDM laser frequencies.

7. The Apparatus of claim 1 wherein the first and second auxiliary laser frequencies signals lie within the band of the WDM laser frequencies.

8. The Apparatus of claim 1 wherein the accurate electrical frequency standard signal is selected from a group including a stratum clock signal, a Sonet line signal, a national frequency standard, and a global positioning system (GPS) distributed frequency standard.

9. A method of stabilizing laser frequencies used in a wavelength division multiplexed (WDM) system comprising the steps of:

(a) locking each of the WDM laser frequencies to a different resonant frequency of an optical interferometer, the optical interferometer having a free spectral range (FSR) which is a fraction of the separation between the WDM laser frequencies; and (b) locking a different resonant frequency of the optical interferometer to an accurate electrical frequency standard signal.

10. The method of claim 9 wherein step (a) includes the steps of:

modulating each WDM laser frequency using a unique electrical dither signal;

multiplexing together each of the dithered WDM laser frequencies into a multiplexed signal;

receiving the multiplexed signal at an optical resonator and generating an optical frequency offset error signal for each WDM laser frequency;

detecting the optical error signals for each laser and for generating an electrical error signal for each WDM laser frequency; and comparing each electrical error signal with the electrical dither signal and in response thereto generating a separate feedback control signal for adjusting the frequency of each of the WDM lasers.

11. The method of claim 9 wherein step (b) includes the steps of:

combining a first and second auxiliary laser frequencies signals;

detecting the first and the second auxiliary laser frequency signals and generating therefrom an electrical difference frequency signal;

comparing the accurate electrical frequency standard signal with the electrical difference frequency signal and generating therefrom an error control signal for controlling the resonance frequencies of the optical resonator so as to minimize the error control signal.

* * * * *